United States Patent [19]
Yoshino

[11] Patent Number: 5,019,725
[45] Date of Patent: May 28, 1991

[54] INPUT CIRCUIT

[75] Inventor: Kenji Yoshino, Sakae, Japan

[73] Assignee: Texas Instruments Incorporated, Dallas, Tex.

[21] Appl. No.: 416,615

[22] Filed: Oct. 3, 1989

[30] Foreign Application Priority Data

Oct. 7, 1988 [JP] Japan .............................. 63-254566

[51] Int. Cl.⁵ ............................................ H03K 17/16
[52] U.S. Cl. .................................... 307/443; 307/452; 307/481; 307/594
[58] Field of Search ............... 307/443, 451, 452, 481, 307/358, 592, 594, 354, 362, 572

[56] References Cited

U.S. PATENT DOCUMENTS

| | | | |
|---|---|---|---|
| 4,598,216 | 7/1986 | Lauffer et al. | 307/481 X |
| 4,609,834 | 9/1986 | Gal | 307/443 |
| 4,758,743 | 7/1988 | Dehganpour et al. | 307/443 |
| 4,782,252 | 11/1988 | Levy et al. | 307/443 X |
| 4,818,901 | 4/1989 | Young et al. | 307/451 |
| 4,839,538 | 6/1989 | Curtis | 307/443 X |
| 4,880,997 | 11/1989 | Steele | 307/443 |

*Primary Examiner*—David Hudspeth
*Attorney, Agent, or Firm*—William E. Hiller; N. Rhys Merrett; Melvin Sharp

[57] ABSTRACT

Input circuit having an input terminal for accepting an input signal varying between "high" and "low" voltage magnitudes, wherein the input circuit is provided with a compensated threshold voltage located between the "high" and "low" voltage magnitudes for properly characterizing the status of the input signal depending upon whether the input signal has a voltage above or below the threshold voltage. The input circuit has a load circuit disposed between a power supply side and an input stage of the input circuit. The load circuit includes a logic element and operates to temporarily increase the threshold voltage associated with the input stage in response to noise generated at the ground side of the input circuit, thereby preventing the noise level from surpassing the threshold voltage as temporarily increased. The compensated threshold voltage enables the input circuit to avoid malfunction by putting out an output signal appearing to have an incorrect "low" status rather than the correct "high" status otherwise caused by the generation of noise at the ground side at a level greater than the normal threshold voltage of the input circuit.

12 Claims, 4 Drawing Sheets

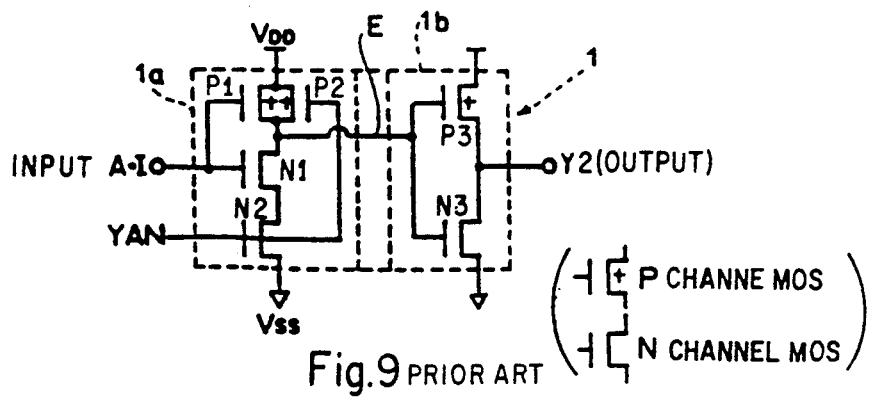
Fig. 9 PRIOR ART
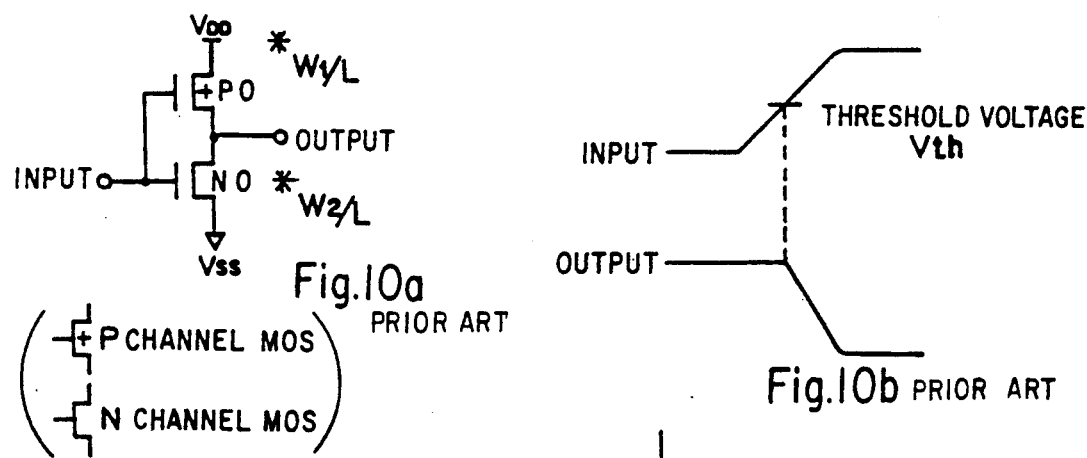
Fig. 10a PRIOR ART
Fig. 10b PRIOR ART
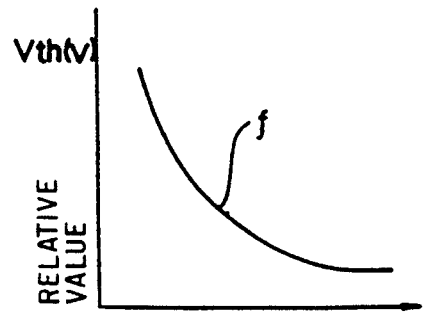
Fig. 10c PRIOR ART
\* $W_1$ and $W_2$ indicate channel width respectively
L indicates channel length

INPUT CIRCUIT

BACKGROUND OF THE INVENTION

1. Field of the Invention

This invention relates to input circuits, for example, to input circuits of dynamic RAMs (Random Access Memories).

2. Description of the Prior Art

Conventionally, for example, in dynamic RAMs, internal circuits such as sense amplifiers (e.g., $2^{10} = 1024$ sense amplifier circuits in the case of a 1 mega-bit DRAM or the like operate in reading data as output from memories, writing data for input to memories, or the like. At this time a large amount of current momentarily flows at a ground side (ground lines) of the internal circuits. Therefore, an electric potential ($V_{SS}$) at the ground side momentarily rises, and noise is momentarily generated, which may induce the circuits to malfunction.

Malfunction of the circuits caused by the generation of noise in the above dynamic RAMs or the like is likely to occur, for example, in input circuits of CMOS (Complementary MOS) circuits or the like between row address inputs and row address buffers.

With regard to FIG. 9, an A·I (address input) terminal is respectively connected to a gate of an N channel MOS transistor $N_1$ and to a gate of a P channel MOS transistor $P_1$, and the P channel MOS transistors $P_1$ and $P_2$ are respectively connected in parallel (i.e., sources of $P_1$ and $P_2$ are connected, and drains of $P_1$ and $P_2$ are connected, respectively), and the sources of MOS transistors $P_1$ and $P_2$ are respectively connected to a power supply side ($V_{DD}$). Furthermore, a gate of the P channel MOS transistor $P_2$ is connected to a gate of an N channel MOS transistor $N_2$ and to a clock YAN (e.g., 4.5V: a clock which makes the above address buffer circuit active). The drains of P channel MOS transistors $P_1$ and $P_2$ are respectively connected to a drain of the N channel MOS transistor $N_1$; a source of the transistor $N_1$ is connected to a drain of the transistor $N_2$; and a source of the transistor $N_2$ is connected to the ground side ($V_{SS}$), all of which constitutes an input circuit stage 1a.

Also, the drain of the N channel MOS transistor $N_1$ (or the drains of the P channel MOS transistors $P_1$ and $P_2$) is respectively connected to a gate of a P channel MOS transistor $P_3$ and to a gate of an N channel MOS transistor $N_3$. A source of the transistor $P_3$ is connected to the power supply side ($V_{DD}$), and its drain is connected to a drain of the transistor $N_3$. Moreover, a source of the transistor $N_3$ is connected to the ground side ($V_{SS}$), and the drains of the P channel transistor $P_3$ and the N channel transistor $N_3$ are respectively connected to an output terminal $Y_2$, all of which constitutes an inverter stage 1b.

The above input circuit stage 1a and inverter stage 1b of FIG. 9 constitute an input circuit 1.

Next, referring to the operation of the input circuit 1 with regard to FIGS. 9 and 3, when the A·I (input) terminal is at the level "L", the P channel MOS transistor $P_1$ turns on; the N channel MOS transistor $N_2$ turns off; and an electric potential at the point E turns to the level "H". Furthermore, the P channel MOS transistor $P_3$ turns off; the N channel MOS transistor $N_3$ turns on; and the level "L" is output at the terminal $Y_2$ (output).

Next, when the A·I (input) terminal is at the level "H", the P channel MOS transistor $P_1$ turns off; the N channel MOS transistor $N_1$ turns on; and an electric potential at the point E turns to the level "L". The P channel MOS transistor $P_3$ turns on; the N channel MOS transistor $N_3$ turns off; and the level "H" is output at the terminal $Y_2$ (output).

Because a voltage, for example 4.5V, is always applied by the clock YAN to the gates of the P channel MOS transistor $P_2$, $N_2$, and the N channel MOS transistor $N_2$, the transistor $P_2$ is always in the off state, and the transistor $N_2$ is always in the on state. The inverter stage 1b operates normally without any effect from noise.

The description which follows illustrates a case in which noise occurred at the ground side ($V_{SS}$), because of a reason such as the above, at one moment of the time when the A·I terminal (input) is at the level "H". In the input signal level of dynamic RAMs in general, for example, the level "H" is 2.4V and above; the level "L" is 0.8V and below; and a threshold voltage is generally set at about 1.6V. If an electric potential rise (noise), for example of 2V, occurs momentarily at the ground side ($V_{SS}$), a threshold voltage (e.g., about 1.6V) of the input circuit stage 1a (outer input level) will be immediately surpassed.

Therefore, as described above, the electric potential at the point E, which should be at the level "L", turns to the level "H" at the moment the noise occurs, and the level "L" is momentarily output at the $Y_2$ terminal which should have the level "H" output, as shown by the curve e in the time chart of FIG. 3 (i.e., this will be a cause for a malfunction of the internal circuit). This will adversely affect, for example, a row address buffer which will be later described.

Therefore, to reduce the noise at the ground side ($V_{SS}$), the ground lines could be made larger, or a ground line could be connected to the row address buffer, but these approaches will have an unfavorable effect in efforts to minimize the elements of an electronic device, such as a DRAM.

Also, in CMOS circuits as in NMOS circuits, a method (a so-called sensing method) could be utilized in which a noise which is similar to the one generated at the ground side is applied to an input circuit side and a reference side. However, this sensing method requires a reference voltage generation circuit or the like, which makes the circuits complicated and delays the operation speed of the circuits, so that this method is not generally used in the CMOS circuits or the like.

As shown in FIGS. 10 (a), (b), and (c), in a CMOS circuit (an inverter in this case), a threshold voltage $V_{th}$ of an input circuit is generally controlled by the relative channel sizes of a P channel MOS transistor $P_0$ and an N channel MOS transistor $N_0$. That is, by keeping a channel length L constant, a ratio ($W_1/W_2$) of a channel width $W_1$ of the P channel MOS transistor $P_0$ and a channel width $W_2$ of the N channel MOS transistor $N_0$ determines the threshold voltage $V_{th}$, as shown by the curve f in FIG. 10 (c).

Therefore, as in the above, the threshold voltage $V_{th}$ is determined by the transistor size when the transistor is being designed, and once it is determined, the threshold voltage $V_{th}$ cannot be controlled by the same method.

SUMMARY OF THE INVENTION

A purpose of the invention is to provide a highly reliable input circuit which can prevent malfunction caused by noise generated by the operation of an internal circuit.

This invention relates to such input circuit which is so constituted that an input circuit stage, which operates on receiving an input signal, is connected between a power supply side and a ground side, and that at least a load circuit is connected between the power supply side and the input circuit stage, and that a threshold voltage of the input circuit stage is varied by the load circuit, corresponding to noise when it is generated at the ground side.

BRIEF DESCRIPTION OF THE DRAWINGS

FIG. 9 is a circuit diagram showing a conventional input circuit of a dynamic RAM; and FIGS. 1 (a), (b), and (c) are diagrams showing a conventional method to determine a threshold voltage of a CMOS circuit according to the prior art.

DESCRIPTION OF THE PREFERRED EMBODIMENTS

Hereinafter, embodiments of the invention will be described.

FIGS. 1-5 show an embodiment in which the invention is applied to an input circuit of a dynamic RAM. The input circuit here is, for example, a CMOS circuit between a row address and a row address buffer 5 shown in FIG. 5.

Figure 1:
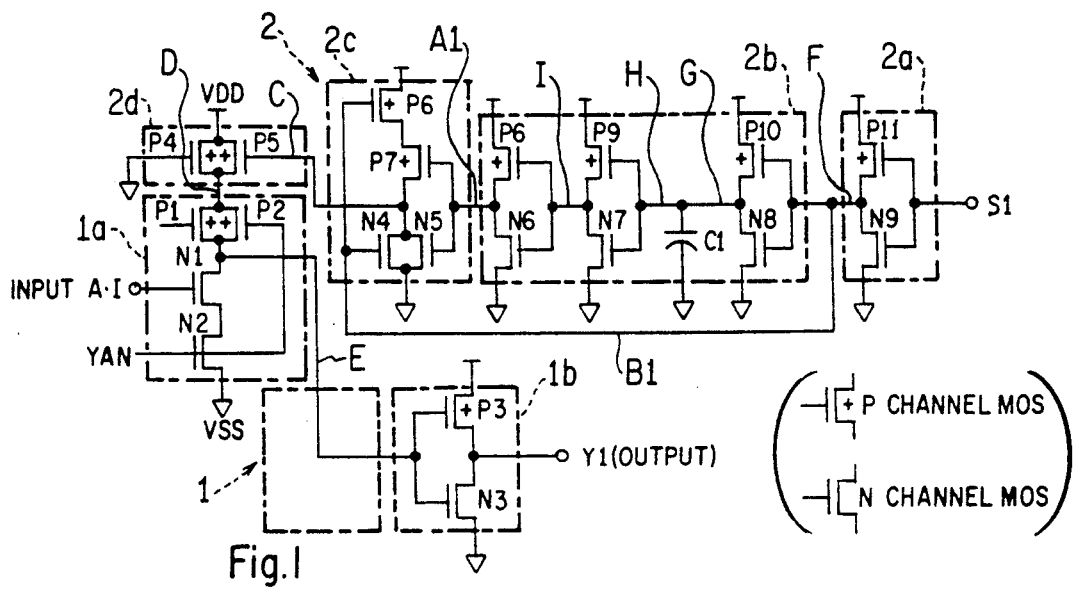
FIG. 1 is a circuit diagram showing an embodiment of an input circuit of a dynamic RAM in accordance with the present invention.

As seen in FIG. 1, because an input circuit stage $1a$ in the input circuit 1 in accordance with the invention is the same as the one in FIG. 9, the other different components will be mainly described hereinbelow.

A load circuit 2 is connected between the input circuit stage $1a$ and a power supply. In this load circuit, a source of a P channel MOS transistor $P_{11}$ is connected to a power supply side ($V_{DD}$); its drain is connected to a drain of an N channel MOS transistor $N_9$, respectively; and a source of the N channel MOS transistor $N_9$ is connected to a ground side ($V_{SS}$). Gates of the transistor $P_{11}$ and the transistor $N_9$ are respectively connected to a clock input terminal $S_1$ (which inputs a clock to operate a sense amplifier 9 in FIG. 5). Inputting a clock to the clock input terminal $S_1$ to operate the sense amplifier 9 in FIG. 5, can be readily achieved by connection with lines or the like provided from a control circuit 8 in FIG. 5.

The drains (output) of the P channel MOS transistor $P_{11}$ and the N channel MOS transistor $N_9$ are respectively connected to gates of a P channel MOS transistor $P_6$ and an N channel MOS transistor $N_4$, and the drains of the transistors $P_{11}$ and $N_9$ are also respectively connected to gates of a P channel MOS transistor $P_{10}$ and an N channel MOS transistor $N_8$.

A source of the P channel MOS transistor $P_{10}$ is connected to the power supply side ($V_{DD}$), and a drain of the transistor $P_{10}$ is connected to a drain of the N channel MOS transistor $N_8$. A source of the transistor $N_8$ is connected to the ground side ($V_{SS}$), and the gate of the transistor $P_{10}$ and the gate of the transistor $N_8$ are connected to each other, and a CMOS output of the transistors $P_{11}$ and $N_9$ is input thereto.

The drains of the P channel MOS transistor $P_{10}$ and the N channel MOS transistor $N_8$ are connected to a positive side of a capacitor $C_1$, and to gates of a P channel MOS transistor $P_9$ and an N channel MOS transistor $N_7$, respectively, and a negative side of the capacitor $C_1$ is connected to the ground side ($V_{SS}$).

A source of the P channel MOS transistor $P_9$ is connected to the power supply side ($V_{DD}$), and a drain of the transistor $P_9$ is connected to a drain of the N channel MOS transistor $N_7$. Also, a source of the transistor $N_7$ is connected to the ground side ($V_{SS}$).

The drains of the P channel MOS transistor $P_9$ and the N channel MOS transistor $N_7$ are respectively connected to gates of a P channel MOS transistor $P_8$ and an N channel MOS transistor $N_6$.

A source of the P channel MOS transistor $P_8$ is connected to the power supply side ($V_{DD}$), and a drain of the transistor $P_8$ is connected to a drain of the N channel MOS transistor $N_6$. A source of the transistor $N_6$ is connected to the ground side ($V_{SS}$), and the drains of the transistor $P_8$ and the transistor $N_6$ are respectively connected to gates of a P channel MOS transistor $P_7$ and an N channel MOS transistor $N_5$.

A source of the P channel MOS transistor $P_6$ is connected to the power supply ($V_{DD}$), and a drain of this transistor $P_6$ is connected to a source of the P channel MOS transistor $P_7$. A drain of the P channel MOS transistor $P_7$ is respectively connected to drains of the N channel MOS transistors $N_4$ and $N_5$. The N channel MOS transistors $N_4$ and $N_5$ are respectively connected to each other at their drains and at their sources, and the sources of the transistors $N_4$ and $N_5$ are respectively connected to the ground side ($V_{SS}$).

P channel MOS transistors $P_4$ and $P_5$ are connected to each other at their sources and at their drains; the sources of the transistors $P_4$ and $P_5$ are respectively connected to the power supply side ($V_{DD}$); and their drains are respectively connected to sources of transistors $P_1$ and $P_2$. A gate of the transistor $P_4$ is connected to the ground side ($V_{SS}$), and a gate of the transistor $P_5$ is connected to the drain of the P channel MOS transistor $P_7$ and to the drains of the N channel MOS transistors $N_4$ and $N_5$, respectively.

Figure 2:
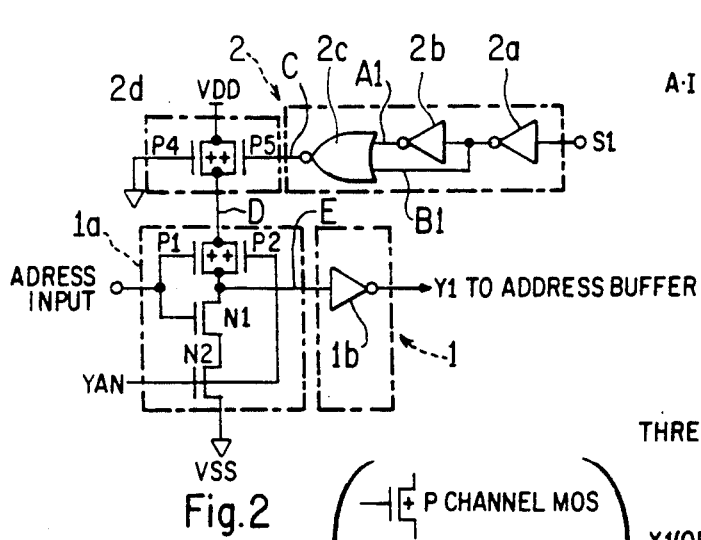
FIG. 2 is a simplified equivalent circuit diagram shown in logic symbols of a part of the input circuit of FIG. 1.

As described in the above, the circuit portion $1a$ shown in broken lines in FIGS. 1 and 2 is an inverter stage; $2b$ is a delay circuit; $2c$ is a NOR logic circuit $2d$ is a load circuit stage; and each of these components constitutes a load circuit 2.

Next, the operatino of the load circuit 2 will be described with regard to FIGS. 1 and 3.

Figure 3:
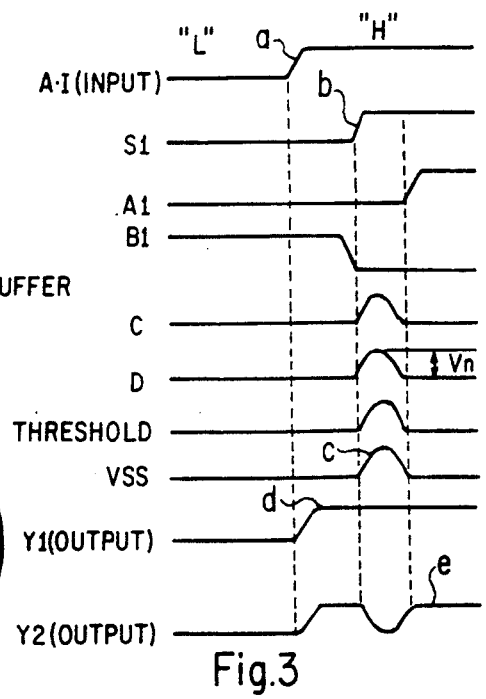
FIG. 3 is a time chart showing voltage waveforms from the operation of the input circuit FIG. 1.
Figure 4:
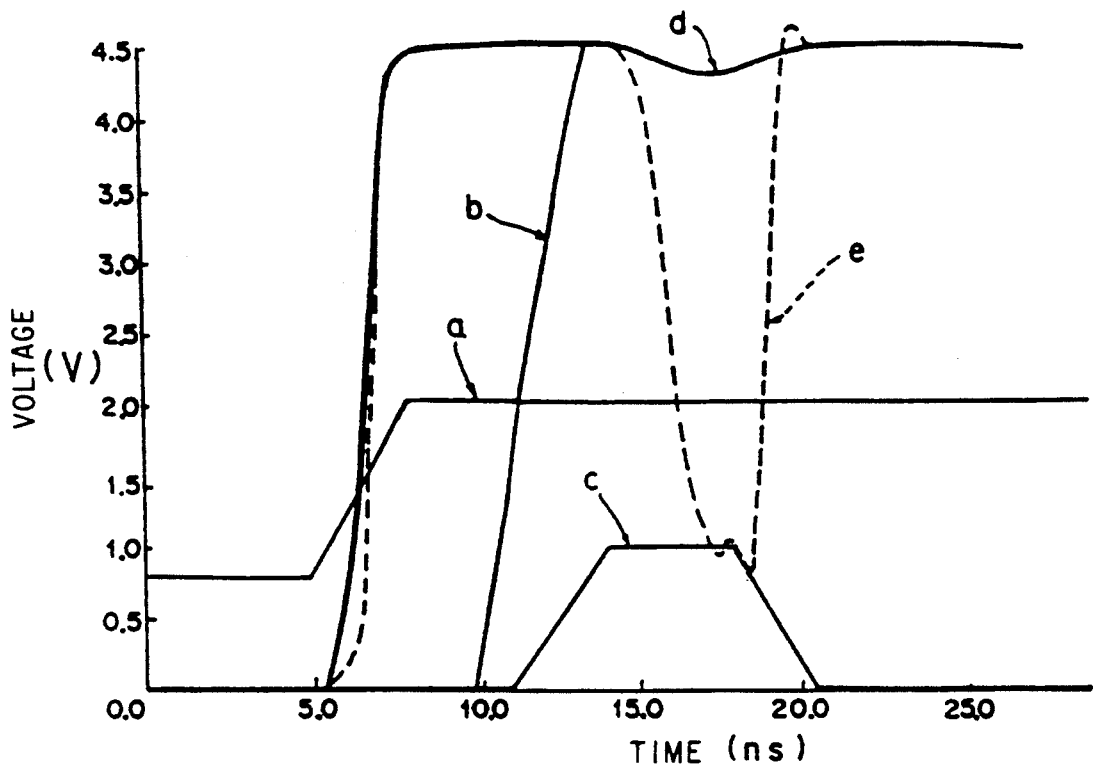
FIG. 4 is a time chart showing the actual voltage-time characteristics of the input circuit of FIG. 1.

The following description refers to the case in which a waveform clock signal shown by the curve b in FIG. 3 (i.e., the same clock signal as the signal for operating the sense amplifier 9) is applied to the clock input terminal $S_1$. First, when the terminal $S_1$ is at the level "L", the P channel MOS transistor $P_{11}$ turns on; the N channel MOS transistor $N_9$ turns off; and th eelectric potential at the point F turns to the level "H". The P channel MOS transistor $P_{10}$ turns off; the N channel MOS transistor $N_8$ turns on; and the electric potential att eh point G turns to the level "L". When the point G is at the level "L", either the capacitor $C_1$ is not operating, or the electric charge charged when the point G is at the level "H", is discharged into the ground side ($V_{SS}$).

Because the electric potential at the point H is at the level "L", the P channel MOS transistor $P_9$ turns on; the N channel MOS transistor $N_7$ turns off; and the electric potential at the point I turns to the level "H". Furthermore, the P channel MOS transistor $P_8$ turns off; the N channel MOS transistor $N_6$ turns on; and the electric potential at the point $A_1$ is at the level "L", as seen in FIG. 3.

When the point $A_1$ is at the level "L", the P channel MOS transistor $P_7$ turns on, and the N channel MOS transistor $N_5$ turns off. As described previously, because the point F is at the level "H" (i.e., the point $B_1$ is at the level "H"), the P channel MOS transistor $P_6$ turns off; the N channel MOS transistor $N_4$ turns on; and the electric potential at the point C is at the level "L"(see FIG. 3).

When the point C is at the level"L", the P channel MOS transistor $P_5$ turns on, and because the P channel MOS transistor $P_4$ is always in the state of on (for the gate of the transistor $P_4$ is connected to the ground side $V_{SS}$), impedance between the power supply side ($V_{DD}$) and the point D increases. Therefore, the electric potential at the point D decreases (see FIG. 3).

Next, regarding the operation where the terminal $S_1$, is at the level "H" (noise) the P channel MOS transistor $P_{11}$ turns off; the N channel MOS transistor $N_9$ turns on; and the electric potential at the point F turns to the levle "L". The P channel MOS transistor $P_{10}$ turns on; the N channel MOS transistor $N_8$ turns off; and the electric potential at the point G turns to the level "H". At this time, the capacitor $C_1$ is momentarily charged with the electric charge, and the electric potential at the point H turns to the level "L" at that moment. At this time, the electric charge charged to the capacitor $C_1$ will be discharged into the ground side ($V_{SS}$), when the N channel MOS transistor $N_8$ later turns on.

When the electric potential at the point H momentarily turns to the level "L", the P channel MOS transistor $P_9$ turns on; the N channel MOS transistor $N_7$ turns off; and the electric potential at the point I turns to the level "H". The P channel MOS transistor $P_8$ turns off; the N channel MOS transistor $N_6$ turns on; and the electric potential at the point $A_1$ turns to the level "L" (see FIG. 3). Furthermore, when the point $A_1$ is at the level "L", the P channel MOS transistor $P_7$ turns on, and the N channel MOS transistor $N_5$ turns off. Because the electric potential at the above point F is at the level "L" (i.e., the electric potential at the point $B_1$ is at the level "L"), the P channel MOS transistor $P_6$ turns on; the N channel MOS transistor $N_4$ turns off; and the electric potential at the point C momentarily rises to the level "H" (see FIG. 3). When the capacitor $C_1$ is fully charged, at the next moment the electric potential at the point H immediately turns to the level "H"; each transistor operates contrary to the above description; and the electric potential at the point C momentarily falls to the level "L". That is, the electric potential at the point C falls down at the moment the electric potential rises up, and the same one-shot waveform as of the noise generated at the ground side ($V_{SS}$) is formed.

Therefore, when the point C is momentarily at the level "H", the P channel MOS transistor $P_5$ turns off, so that the impedance between the power supply side ($V_{DD}$) and the point D decreases, and the electric potential at the point D momentarily rises by $V_n$, as shown in FIG. 3. That is, a threshold voltage of the input circuit stage $1a$ rises only at the moment when the noise occurs at the ground side ($V_{XX}$). The amount of the threshold voltage may be determined by the dimension sizes of the P channel MOS transistors $P_4$ and $P_5$, that is, for example, the channel length or the channel width (transistor size), in the load circuit stage $2d$. The magnitude of $V_n$ may be determined by the capacity of the capacitor $C_1$.

As described previously, the input circuit of the embodiment of FIG. 1 is so constituted that the load circuit 2 is connected between the power supply side ($V_{DD}$) and the input circuit stage $1a$, and that the load circuit 2 raises the threshold voltage of the input circuit stage $1a$, corresponding to the noise when it is generated (when the sense amplifier operates) at the ground side ($V_{SS}$), so that in the input circuit 1 as described above, when a noise occurs at the ground side ($V_{SS}$) at one moment of the time when the A·I input (outer input) is at the level"H", the noise level at the point E does not surpass the threshold voltage. Therefore, because the electric potential at the point E does not momentarily turn to the level "H" as in a conventional input circuit, and can retain the level "L", the $Y_1$ output can output a regular signal corresponding to an input (i.e., malfunction does not occur), as shown by the curve d in FIG. 3. Therefore, a row address buffer 5, for example, which will be later described, will not be adversely affected.

Figure 5:
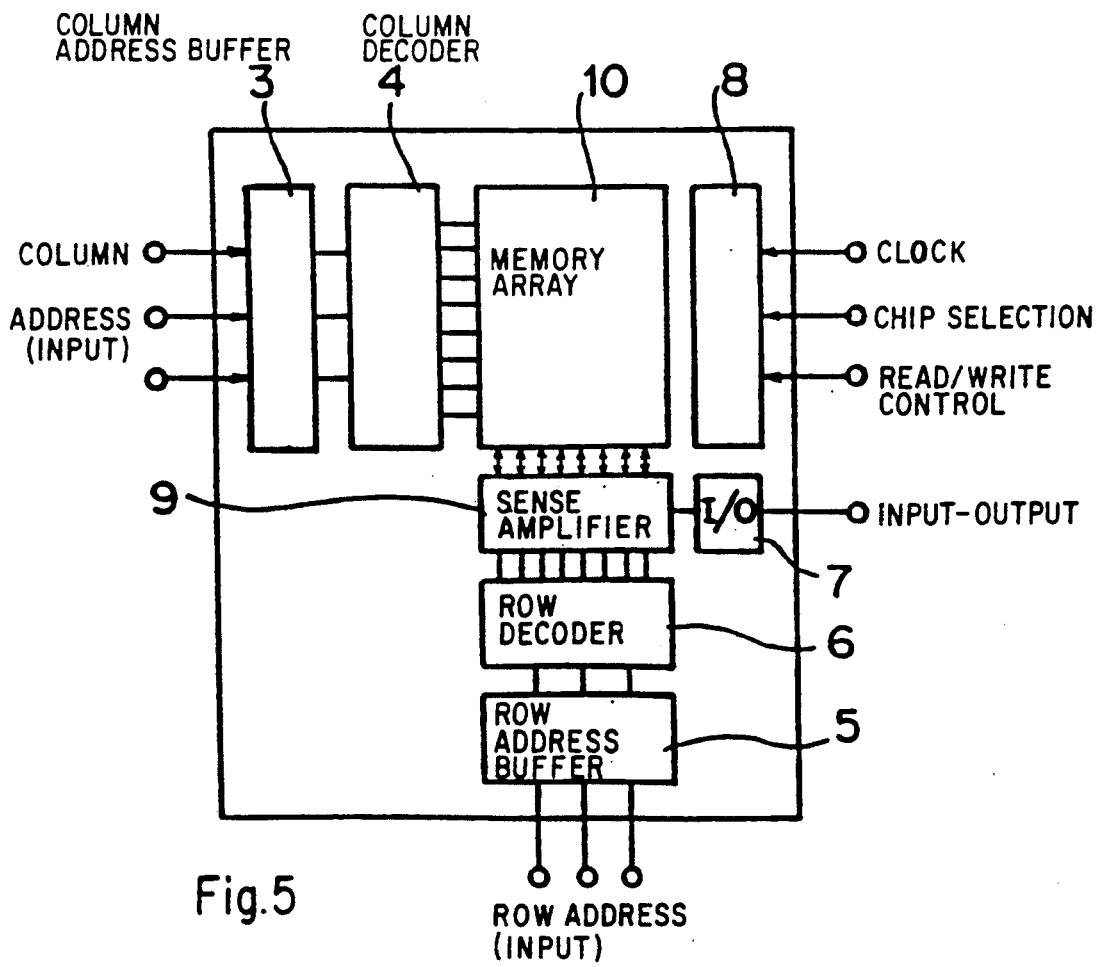
FIG. 5 is a schematic block diagram showing the structure of a dynamic RAM for which the circuit of FIG. 1 may serve as an input circuit.

FIG. 2 is an equivalent circuit diagram of a part of the input circuit of FIG. 1 shown in logic symbols. Referring to FIG. 5, in the dynamic RAM as shown therein, 3 is a column address buffer; 6 is a row decoder; 7 is an input-output circuit; 8 is a control circuit; 9 is a sense amplifier; and 10 is a memory array.

Figure 6:
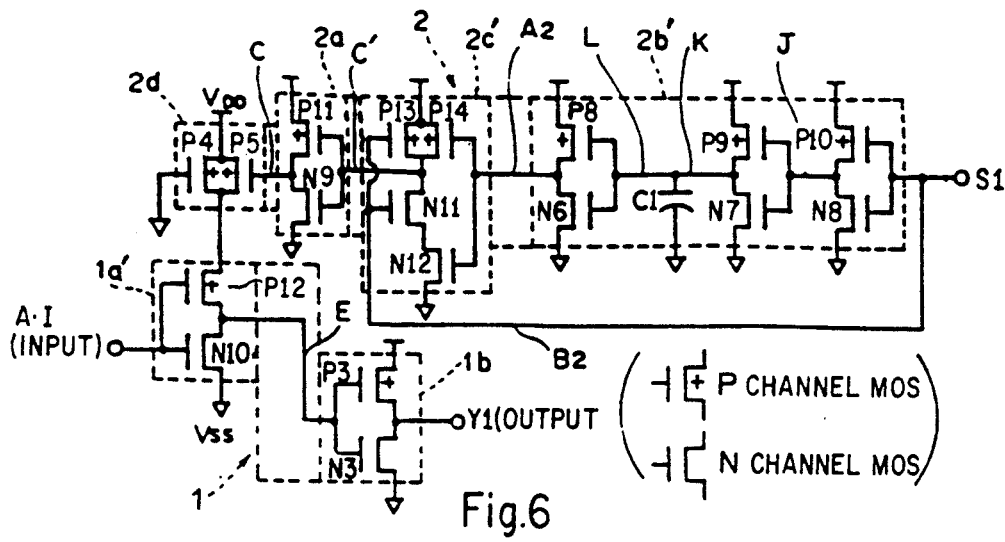
FIG. 6 is a circuit diagram showing another embodiment of an input circuit of a dynamic RAM in accordance with the present invention.
Figure 7:
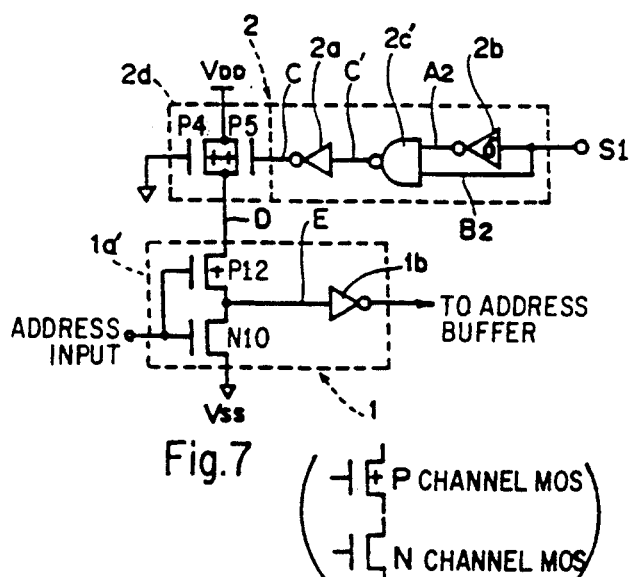
FIG. 7 is a simplified equivalent circuit diagram shown in logic symbols of a part of the input circuit of FIG. 6.
Figure 8:
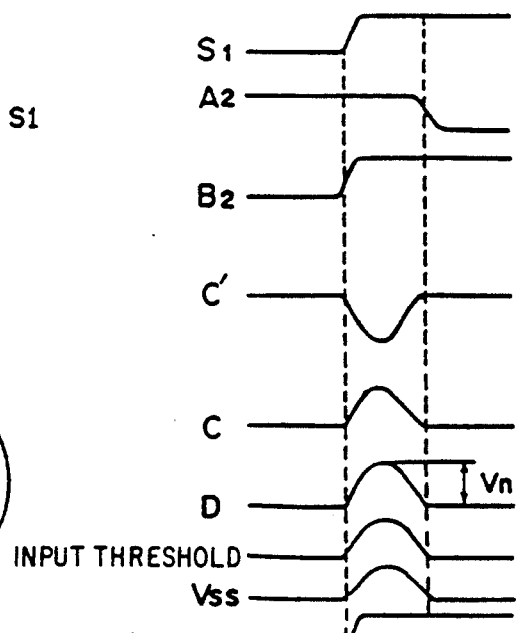
FIG. 8 is a time chart showing the operation of the input circuit of FIG. 6.

FIGS. 6-8 are directed to another embodiment of the input circuit.

The an input circuit of the embodiment shown in FIG. 6 is constituted quite similarly to the one in FIG. 1, but does have different structural aspects which will be described hereinafter. First, in the input circuit 1, an input circuit stage $1a'$ is constituted by an inverter stage which comprises a P channel MOS transistor $P_{12}$ and an N channel MOS transistor $N_{10}$, and the electric potential change which is output at the point E for an A·I input is the same as in the input circuit stage $1a$ of FIG. 1.

Instead of the NOR circuit 2C in the embodiment of FIG. 1, a NAND circuit 2C' is connected in the embodiment of FIG. 6. That is, P channel MOS transistors $P_{13}$ and $P_{14}$ are respectively connected to each other at their sources and at their drains; their sources are respectively connected to the power supply side ($V_{DD}$); and their drains are respectively connected to a drain of an N channel MOS transistor $N_{11}$. A source of the transistor $N_{11}$ is connected to a drain of an N channel transistor $N_{12}$; and a source of the transistor $N_{12}$ is connected to the ground side ($V_{SS}$). A gate of the P channel MOS transistor $P_{13}$ is connected to a gate of the N channel MOS transistor $N_{11}$, and furthermore a gate of the transistor $N_{11}$ is connected to an $S_1$ terminal. A gate of the P channel MOS transistor $P_{14}$ is connected to a gate of the N channel MOS transistor $N_{12}$, and their gates are respectively connected to drains of a P channel MOS transistor P₈ and an N channel MOS transistor N₆.

As seen in FIG. 6, the inverter stage 2a in corresponding to the inverter stage 2a of FIG. 1 is connected between a load circuit stage 2d and the NAND circuit 2C'.

A delay circuit 2b' in the input circuit of FIG. 6 is different from the delay circuit 2b in the embodiment of FIG. 1 in that a capacitor C₁ is connected between an inverter which comprises the P channel MOS transistor P₈ and th eN channel MOS transistor N₆, and an inverter which comprises a P channel MOS transistor P₉ and an N channel MOS transistor N₇.

The operation of the input circuit of FIG. 6 will be described with reference to FIG. 8, in which a description of the circuit components which operate in the same manner as in the embodiment of FIG. 1 may be omitted.

With regard to a case in which noise occurs momentarily at the ground side (V$_{SS}$) when the A·I input is at the level "H" (i.e., a case in which the sense amplifier 9 is operated by causing a clock signal to enter the terminal S₁), when the terminal S₁ is at the level "H", the electric potential at the point J turns to the level "L", and the electric potential at the point K turns to the level "H". At this time, the capacitor C₁ is momentarily charged with electric charge; at this moment the electric potential at the point L turns to the level "L"; the electric potential at the point A₂ turns to the level "H" as in FIG. 8; and the N channel MOS transistor N₁₂ turns on. Because the electric potential at the point B₂ at this time is at the level "H", the N channel MOS transistor N₁₁ turns on, and the electric potential at the point C' momentarily falls. That is, the electric potential at the point C momentarily rises. After the capacitor C₁ is fully charged with the electric charge, the electric potential at the point "L" turns instantly from the level "L" to the level "H"; each transistor operates contrary to the above; and an one-shot waveform as shown in FIG. 8 is formed at the point C', for the same reason as in the embodiment of FIG. 1.

Therefore, a threshold voltage of the input circuit 1 can be raised, by momentarily raising the electric potential at the point D with the load circuit 2, so that the malfunction of the input circuit caused by the generation of noise at the ground side (V$_{SS}$), may be prevented as in the embodiment of FIG. 1.

FIG. 7 is a simplified equivalent circuit diagram of a part of the input circuit of FIG. 6 shown in logic symbols.

Although the invention has been described in relation to the illustrated embodiments of FIGS. 1 and 6, it will be understood that the embodiments of FIGS. 1 and 6 may be further modified based on the technical idea of the invention.

For example, the input circuit and the load circuit may be constructed with appropriate components other than MOS transistors, and their constitution may be variously changed. Also, in addition to components of the load circuit, appropriate circuit elements may be provided between the power supply and the input circuit. Also, the threshold voltage of the input circuit may be changed by electrical characteristics other than the impedance of the load circuit stage.

Moreover, the input circuits of the invention may be applied to other structural elements in addition to dynamic RAMs, and also to analog circuits or the like rather than the logic circuits (digital circuits) as described with respect to the embodiments of FIGS. 1 and 6.

EFFECTS OF THE INVENTION

As described, the input circuit in accordance with the invention is so constituted that it has at least the load circuit stage connected between the power supply side and the input circuit stage, and that the threshold voltage of the input circuit stage is temporarily increased by the load circuit, corresponding to noise when it is generated at the ground side, so that malfunction of the input circuit by the generation of the noise at the ground side may be prevented so as to provide a highly reliable input circuit.

What is claimed is:

1. An input circuit having a threshold voltage compensated for ground side-generated noise, said input circuit comprising:
   input circuit stage means connected between a power supply side and a ground side and having an input terminal for accepting an input signal varying between "high" and "low" voltage magnitudes, said input circuit stage means having a threshold voltage which is at a magnitude located between the "high" and "low" voltage magnitudes; and
   load circuit compensating means connected between the power supply side and said input circuit stage means, said load circuit compensating means including
   means for temporarily increasing the threshold voltage of said input circuit stage means in response to noise generated at the ground side of said input circuit stage means to prevent the noise level from surpassing the threshold voltage as temporarily increased, thereby negating the occurrence of a glitch in the output signal from said input circuit stage means.

2. An input circuit as set forth in claim 1, wherein said input circuit stage means includes means for setting the threshold voltage at a predetermined magnitude between the "high" and "low" voltage magnitudes.

3. An input circuit as set forth in claim 2, wherein said threshold voltage setting means comprises a pair of field effect transistors of the same channel type, each of said field effect transistors having a source, a drain and a gate electrode, and the source and drain of one of said pair of field effect transistors being respectively connected to the source and drain of the other field effect transistor to dispose said pair of field effect transistors in parallel with their sources connected to the power supply side.

4. An input circuit as set forth in claim 1, wherein said load circuit compensating means further includes a delay circuit;
   a clock input terminal operably connected to said delay circuit at the input side thereof; and
   said delay circuit having an output operably connected to said input circuit stage means for delaying a clock signal as input at said clock input terminal;
   the occurrence of a clock signal pulse in said clock signal input giving rise to noise generated at the ground side of said input circuit stage means for activating said means for temporarily increasing the threshold voltage of said input circuit stage means.

5. An input circuit as set forth in claim 4, wherein said delay circuit comprises a plurality of delay stages serially connected along the length of the delay circuit; and
  capacitor means connected between successive delay circuit stages and being directed to the ground side of the input circuit.

6. An input circuit as set forth in claim 5, wherein each of said delay stages comprises a pair of field effect transistors of opposite channel types;
  each of said field effect transistors of a respective one of said delay circuit stages having a source and a drain and a gate electrode extending across the channel between the source and drain;
  the gate electrodes of said pair of field effect transistors of each delay circuit stage being connected; and
  the source of one of said pair of field effect transistors included in the same delay circuit stage being connected to the power supply side, the drains of said pair of field effect transistors being connected to each other, and the source of the other field effect transistor being connected to the ground side.

7. An input circuit as set forth in claim 5, wherein said load circuit compensating means further includes a logic circuit disposed between the output of said delay circuit and said input circuit stage means and respectively connected thereto.

8. An input circuit as set forth in claim 7, wherein said load circuit compensating means further includes a line connecting the input of said delay circuit to said logic circuit.

9. An input circuit as set forth in claim 8, wherein said logic circuit comprises a NOR logic circuit.

10. An input circuit as set forth in claim 8, wherein said logic circuit comprises a NAND logic circuit.

11. An input circuit as set forth in claim 8, wherein said load circuit compensating means further includes a load circuit stage connected between said input circuit stage means and said logic circuit for receiving a voltage from the power supply side.

12. An input circuit as set forth in claim 3, further including means connected to the gate electrode of one of said pair of field effect transistors of said input circuit stage means for providing a clock signal thereto; and
  the input signal being provided to the gate electrode of the other of said pair of field effect transistors of said input circuit stage means.

* * * * *